US007095253B1

(12) United States Patent
Young

(10) Patent No.: US 7,095,253 B1
(45) Date of Patent: Aug. 22, 2006

(54) PROGRAMMABLE MULTI-CHIP MODULE

(75) Inventor: Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 139 days.

(21) Appl. No.: 10/624,832

(22) Filed: Jul. 21, 2003

(51) Int. Cl.
*H03K 19/00* (2006.01)
(52) U.S. Cl. ............................ 326/101; 326/41; 326/47
(58) Field of Classification Search ............ 326/37–47, 326/101
See application file for complete search history.

(56) References Cited

U.S. PATENT DOCUMENTS

| | | | |
|---|---|---|---|
| 5,371,390 A | 12/1994 | Mohsen | |
| 5,400,262 A | 3/1995 | Mohsen | |
| 5,432,708 A * | 7/1995 | Mohsen | ........................ 716/16 |
| 5,654,564 A | 8/1997 | Mohsen | |
| 5,661,409 A | 8/1997 | Mohsen | |
| 5,767,565 A * | 6/1998 | Reddy | ........................ 257/620 |
| 5,801,452 A | 9/1998 | Farnworth et al. | |
| 6,150,717 A | 11/2000 | Wood et al. | |
| 6,204,689 B1 | 3/2001 | Percey et al. | |
| 6,563,340 B1 * | 5/2003 | Jones | ........................ 326/41 |

OTHER PUBLICATIONS

U.S. Appl. No. 10/007,892, filed Nov. 9, 2001, Chee et al.
U.S. Appl. No. 10/608,404, filed Jul. 11, 2003, Young.
Ivo Dobbelaere et al.; "Field Programmable MCM systems—Design of an Interconnection Frame"; FPGA '92—First International ACM/SIGDA Workshop on Field Programmable Gate Arrays; Sponsored by ACM Special Interest Group on Design Automation (SIGDA); pp. 52-56.

* cited by examiner

*Primary Examiner*—Anh Q. Tran
(74) *Attorney, Agent, or Firm*—Kim Kanzaki

(57) ABSTRACT

A multi-chip module comprising: a first IC having a first column of tiles, where each tile includes programmable logic; a second IC having a second column of tiles, where the second column is aligned with the first column; and a carrier die having signal lines, where a tile in the first column is directly connected to a tile in the second column via one of the signal lines.

31 Claims, 12 Drawing Sheets

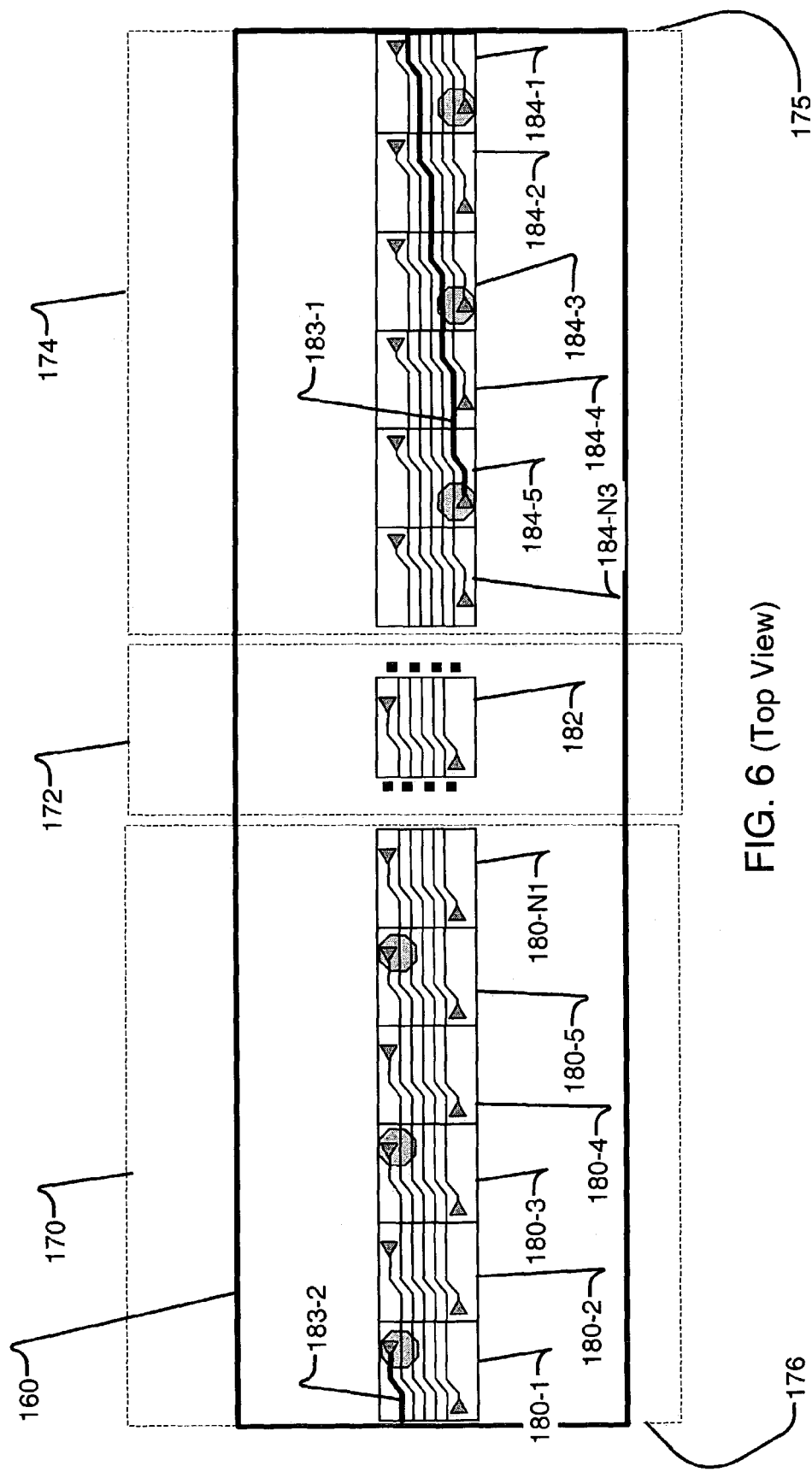
FIG. 6 (Top View)

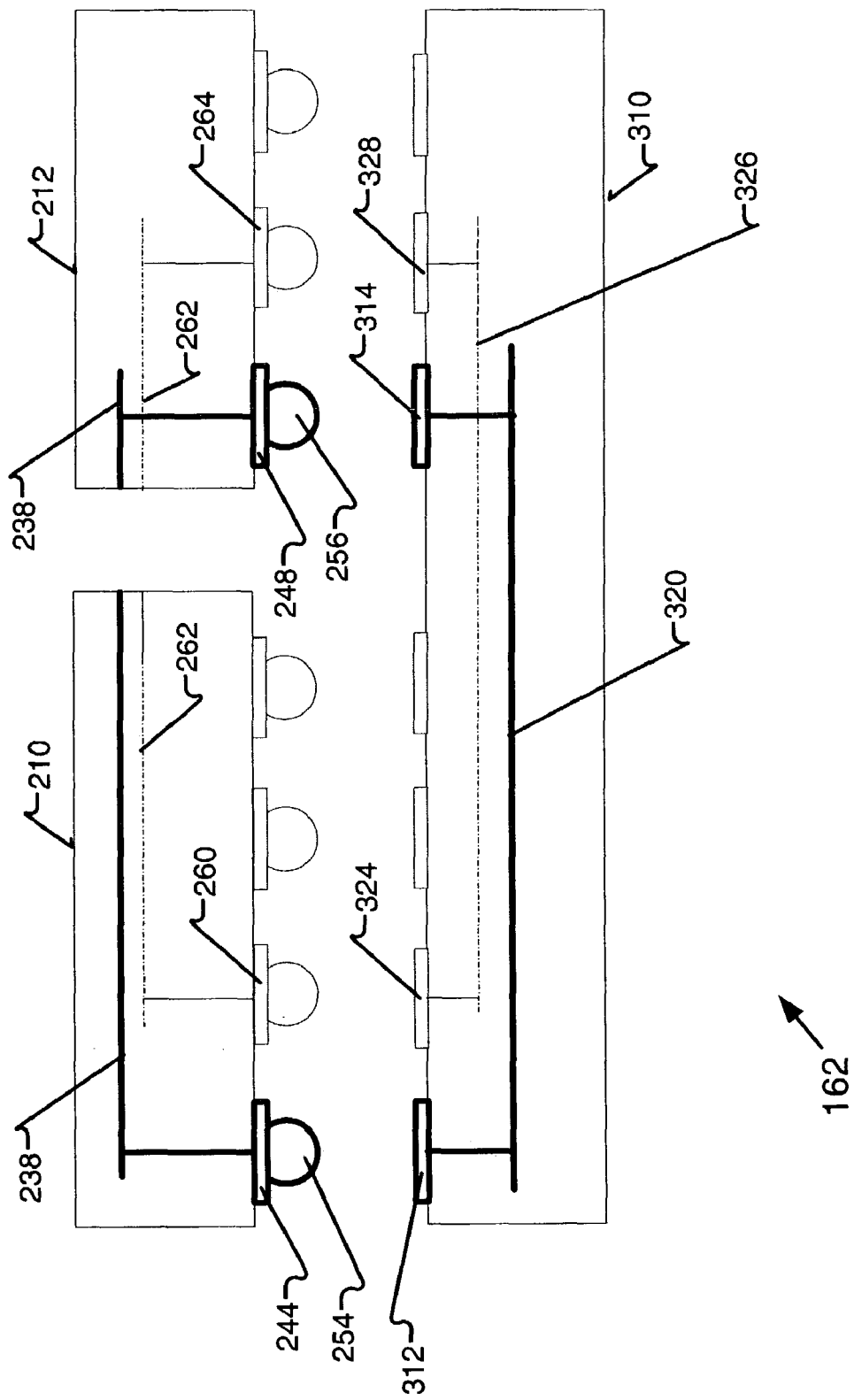
FIG. 7 (Side View)

(Top View)

(Bottom View)

(Top View)

(Bottom View)

PROGRAMMABLE MULTI-CHIP MODULE

FIELD OF THE INVENTION

The present invention relates generally to multi-chip design and more specifically, to a multi-chip module architecture with circuits having programmable functions and interconnects.

BACKGROUND

Field programmable gate arrays (FPGAs) offer an attractive alternative to application specific integrated circuits (ASICs) for specific applications, especially when hardware flexibility is needed, e.g., prototyping. An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured.

FIG. 1 is a block diagram depicting a simplified example of an FPGA 10. FPGA 10 illustratively includes CLBs 17, I/O routing ring 16A, delay lock loop (DLL) blocks 19, multiply/divide/de-skew clock circuits 11, and programmable IOBs 16B. DLL blocks 19 and clock circuits 11 collectively provide well-known digital clock management (DCM) circuits for managing clock signals within FPGA 10. Those skilled in the art understand that FPGA 10 may include other types of logic blocks and circuits in addition to those described herein. For example, there may be programmable Multi-Gigabit Transceivers (MGTs) that are also programmable I/Os and located next to the programmable IOBs 16B. Also, there may be an embedded Application Specific Integrated Circuit (ASIC), such as an embedded processor in the Virtex II Pro™ Platform of Xilinx Corporation of San Jose, Calif.

Recently, FPGA technology has been rapidly improving, hence increasing circuit density on the FPGA die. This has allowed for FPGAs whose circuit complexity may be greater than that of complex ASICs. Thus FPGAS are becoming a replacement for ASICs in more and more cases. However, as the FPGA die gets larger, the probability of a defect on the die increases. Hence as circuit designs get more complex, there is a need for another way to implement the complex designs rather than producing larger and more costly FPGA dice.

One solution for a circuit design larger than the FPGA has been to use multiple FPGAs connected together on a printed circuit board (PCB). However, off-chip communication over the PCB, greatly reduces operating speed of the design as compared to putting the design on one big FPGA die. To improve the chip to chip communications delay, a multi-chip module (MCM) architecture was disclosed in "Field programmable MCM Systems—Design of an Interconnection Frame," by Ivo Dobbelaere, et. al, Proceedings of the First international ACM/SIGDA Workshop on Field Programmable Gate Arrays, Berkley, Calif., Feb. 16–18 1992; pp. 52–56.

In the above article, the MCM system includes modified FPGAs connected together via a carrier die having a fixed, non-programmable, wiring pattern. The modified FPGAs have the CLBs 17 (which is called the core) that is surrounded by a programmable interconnection frame. The programmable interconnection frame supports chip-to-chip connections. At each of the four corners of the core a special switch matrix circuit is provided. Within a switch matrix all horizontal lines can be connected to all vertical lines. Connections between the four switch matrices and between'the core and a switch matrix are provided.

The MCM system described above supports two basic connections. First, a signal from the core of die A is connected via a corner switch matrix to a pin on die A and then to a pin on die B via a fixed wire on the carrier die. The signal is switched through B's programmable interconnection frame to a corner switch matrix in B's core, where it then is connected to B's core. And second, a signal from the core of die A is connected via a corner switch matrix to a pin on die A and then to a first pin on die B via a first fixed connection on the carrier die. The signal is switched to a second pin on die B via B's programmable interconnection frame. The signal then goes from the second pin on die B to a pin on die C via a second fixed connection on the carrier die. The signal from the pin on die C goes to a corner switch matrix in C's core, where it then is connected to C's core.

There are several disadvantages of the above MCM system. First, core to core communications must go through at least two switch matrices and at least one programmable interconnection frame, hence there is delay associated with these switching components in addition to the delay due to the wires/metal traces on the carrier die. Second, when many CLBs on die A need to communicate with many CLBs on die B, the switches at the four corners can become bottlenecks. Third, a signal from a CLB on die A needs to travel to the corner of die A then to the corner of die B then to a CLB on die B, which is a significant distance. And lastly, due to the limited connections between FPGA dice, the typical amount of parallel communications that occurs when all communications are on a single die, is greatly reduced.

Therefore there is a need for a better multi-chip module architecture which overcomes the above disadvantages of the prior art.

SUMMARY

The present invention includes a MCM architecture having a plurality of dice connected together on a supporting structure. An exemplary embodiment of the present invention includes a supporting structure, which may be a carrier die. In another embodiment the supporting structure may include part of the packaging. The exemplary embodiment further includes a column of tiles in which a first tile of the column is connected to a second non-adjacent tile in the column via a signal line, which bypasses the intervening tiles. The first tile is on a first die and the second tile is on a second die. Using flip-chip techniques, the first and second die are placed on a carrier die that has the signal line directly connecting the first tile to the second tile. The result is that effectively a large FPGA has been created from two or more smaller FPGAs with an interconnection bandwidth that is significantly larger than conventional MCM architectures.

An embodiment of the present invention includes a multi-chip device having: a group of aligned regions, where each region has a programmable interconnection; a first IC having a first region of the group of aligned regions; a second IC having a second region of the group of aligned regions; a support structure having one or more signal lines, where the first region is directly connected to the second region via one of the signal lines.

Another embodiment of the present invention includes a multi-chip module having: a first die having a first column of tiles, where each tile includes programmable logic; a second die having a second column of tiles, where the second column is aligned with the first column; and a carrier die having signal lines, where a tile in the first column is directly connected to a tile in the second column via one of the signal lines.

Yet another embodiment of the present invention includes a method for creating a multi-chip module having a plurality of integrated circuits (ICs), where each IC has programmable logic arranged in columns. The method includes the steps of: first, positioning a first IC on a carrier die, where the first IC has a first column of regions, where each region includes a programmable logic block. Next, a second IC is positioned on the carrier die, where the second IC has a second column of regions, where each region includes a programmable logic block, and where the second column is aligned with respect to the first column. And, lastly, a signal wire is configured on the carrier die to directly connect a first region in the first column to a second region in the second column.

An aspect of the present invention includes a system having a plurality of dice, comprising: a first die having a first plurality of columns, where each column has a plurality of substantially identical elements; a second die having a second plurality of columns, where each column has a plurality of substantially identical elements; and multiple signal lines connecting each element of each column of the first plurality of columns with an associated element of the associated column of the second plurality of columns. Thus a column on the first die and its associated column on the second die forms an aggregate column. Each element in the aggregate column has in effect non-adjacent element communications similar to if the elements where all in one column on a single-die (with the caveat that there may be increased delay in the aggregate column).

The present invention will be more full understood in view of the following description and drawings.

BRIEF DESCRIPTION OF THE DRAWINGS

FIG. 6 is an expanded view of region 160 of FIG. 5 of one embodiment of the present invention;

FIG. 7 is an illustrative side view of region 162 of FIG. 5 of another embodiment of the present invention;

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

Figure 5A:
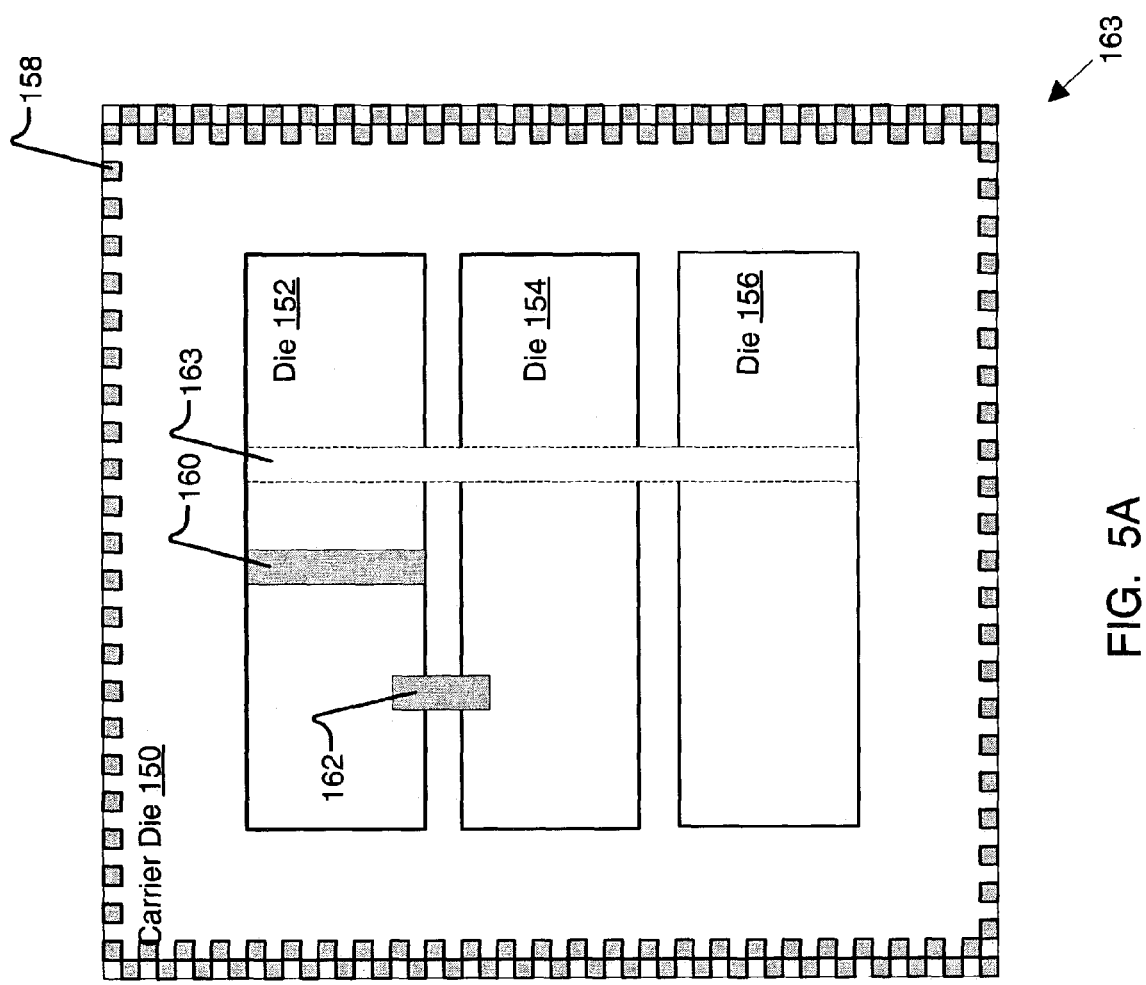
FIG. 5A is a simplified diagram of an MCM of an embodiment of the present invention.

In a preferred embodiment of the present invention two or more die (e.g., dice 152, 154, and 156 in FIG. 5A) are combined together to form a MCM, i.e., in effect a substantially equivalent larger die (e.g., MCM 163 of FIG. 5A). Thus, rather than trying to create larger and larger single dice to handle the increasing complex user applications, smaller dice are made and put together on a carrier die. The major advantage is that, as is known in the industry, it is easier and cheaper to make defect-free small dice than it is to make defect-free large dice. A more detailed description of various embodiments of the present invention is given below.

Figure 1:
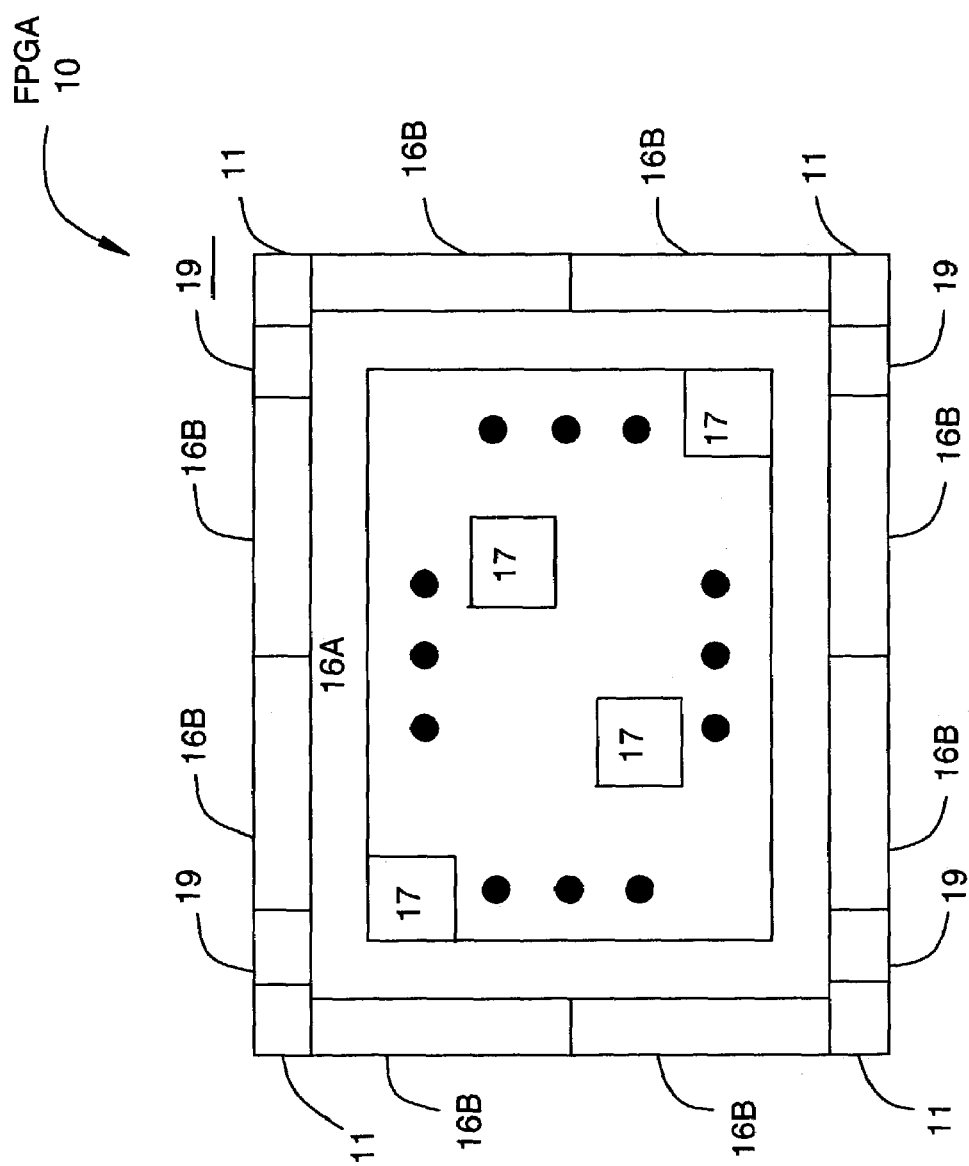
FIG. 1 is a block diagram depicting a simplified example of an FPGA.
Figure 2:
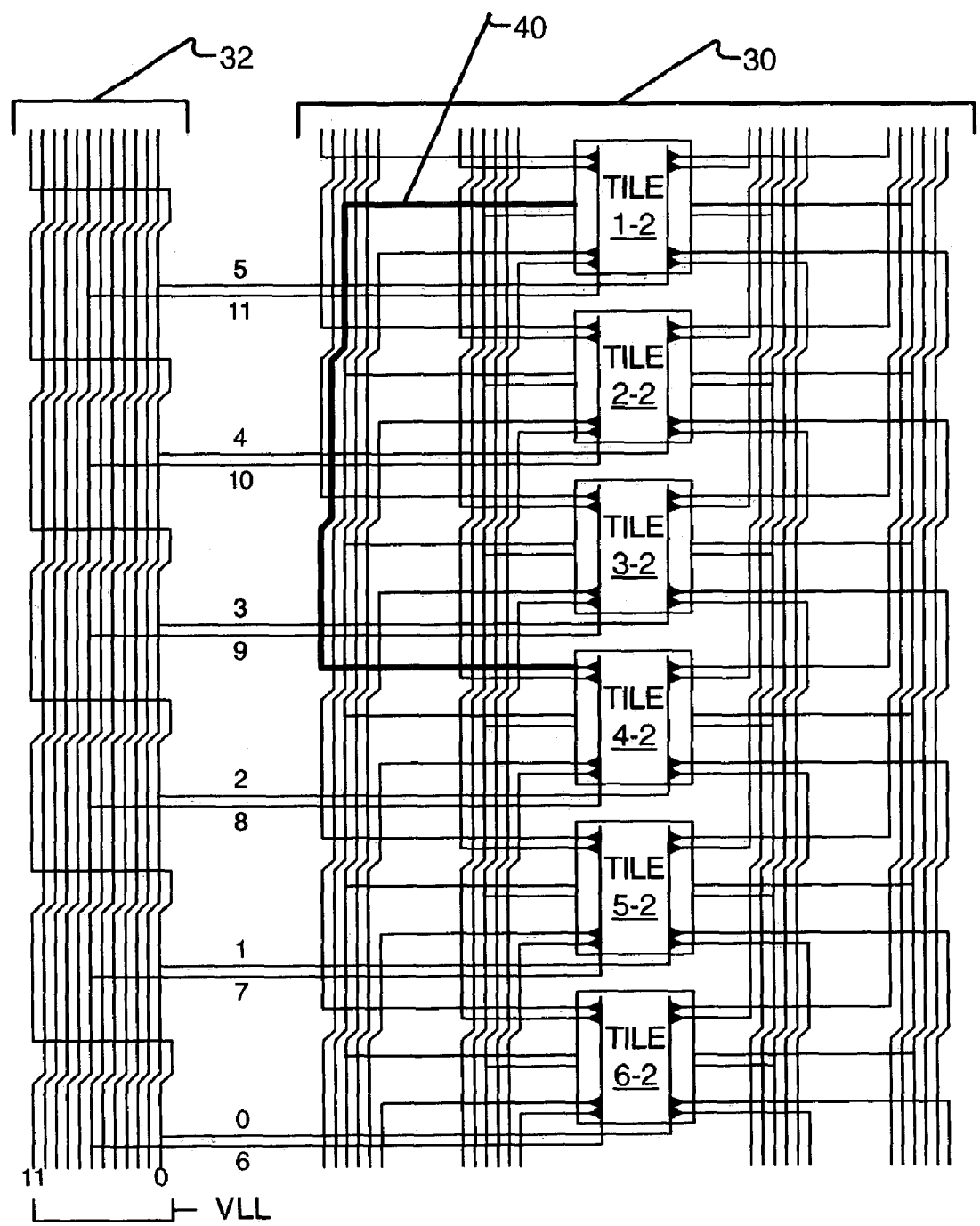
FIG. 2 shows in simplified form some of the interconnect structure connecting the CLBs.

FIG. 2 shows in simplified form some of the interconnect structure connecting the CLBs 17 in FIG. 1. FIG. 2 shows a column of six tiles: 1-2, 2-2, 3-2, 4-2, 5-2, and 6-2, where each tile includes a CLB and a switching structure. FIG. 2. is from FIG. 16B of U.S. Pat. No. 6,204,689 B1, issued Mar. 20, 2001, by Andrew K. Percy, et. al., titled "Input/Output Interconnect Circuit for FPGAs," which is incorporated by reference herein. Bi-directional hex lines 30 and long lines 32 connect together various non-adjacent tiles. For example, bi-directional hex line 40 connects tile 1-2 to tile 4-2. In a preferred embodiment long lines are bi-directional and 24 tiles long. FIG. 2 shows that the bi-directional hex lines 30 and long lines 32 have a staggered and repeatable pattern, i.e., each row in FIG. 2 is the same as the row above and below it. Hence rows can be easily added to increase the size of the circuit.

Figure 3:
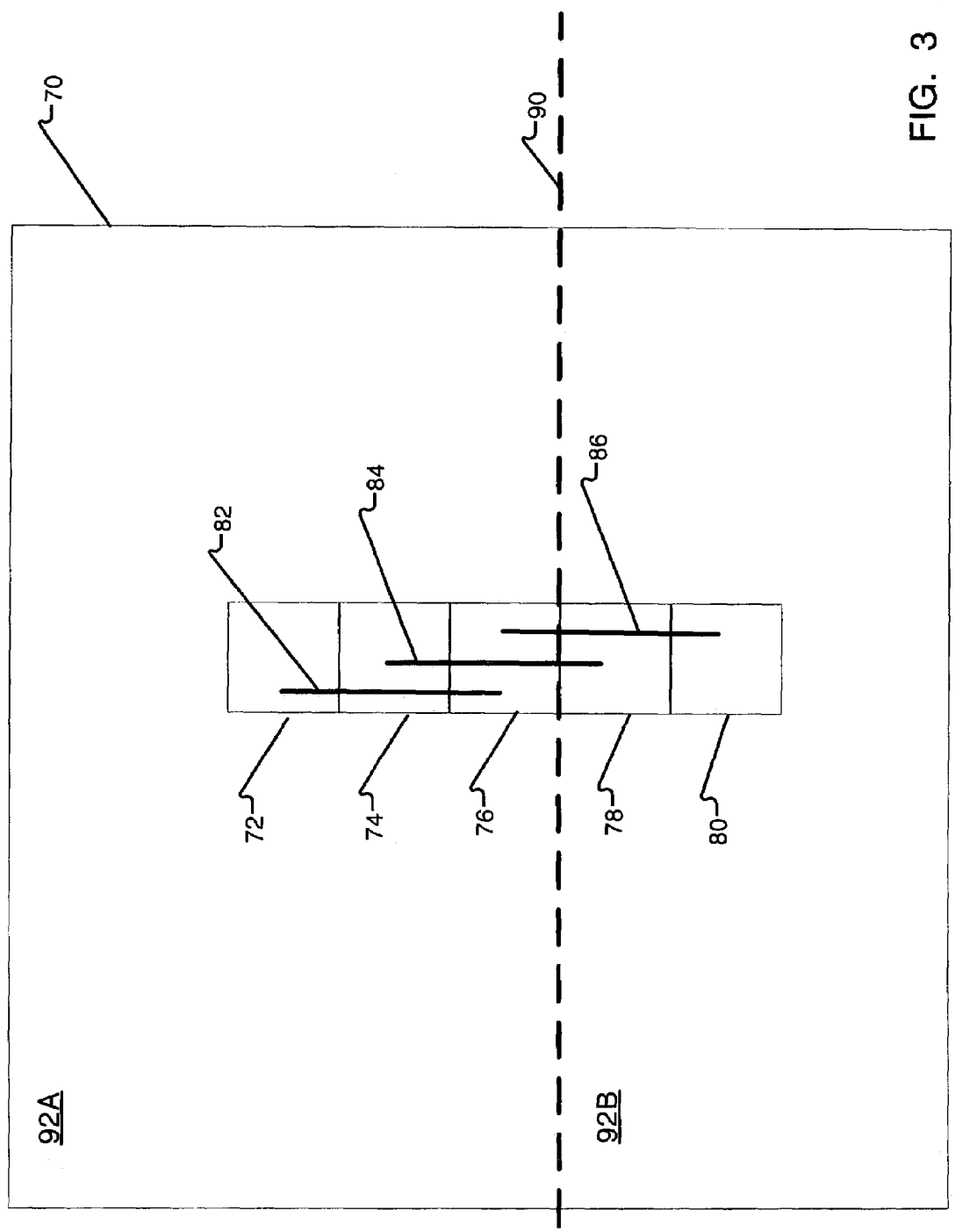
FIG. 3 is a simplified diagram of a column of regions having programmable logic, where non-adjacent regions are interconnected by signal lines.

FIG. 3 is a simplified diagram of a column of regions having programmable logic, where non-adjacent regions are interconnected by signal lines. This diagram has been significantly simplified in order to illustrate the general concept of the preferred embodiment of the present invention. The regions 72, 74, 76, 78, and 80 may be, for example, tiles on an integrated circuit (IC) 70, for example, an FPGA. The signal lines 82, 84, and 86 may be, for example, metal traces or wires, which interconnect non-adjacent regions, 72 to 76, 74 to 78, and 76 to 80, respectively. The signal lines 82, 84, and 86 pass over and have no connections to regions 74, 76, and 86, respectively. In effect these signal lines 82, 84, and 86 are freeways which bypass the local adjacent region traffic.

The connection between two non-adjacent regions, as used herein, includes the direct connection between a first region and a second region, which have at least one interposing region between the first and second regions. The signal lines 82, 84, and 86 are examples of the shortest freeways, in other examples, the signal lines bypass more than one adjacent region. In an alternative embodiment, some freeways may connect adjacent regions.

A cut line 90 will conceptually split IC 70 into two parts: die 92A and die 92B. Separating dice 92A and 92B by a small space disconnects regions 74 from 78 and 76 from 80. In order to have freeway connections similar to signal lines 84 and 86, a carrier die (or a back plane) is used to provide the freeway connections.

Figure 4:
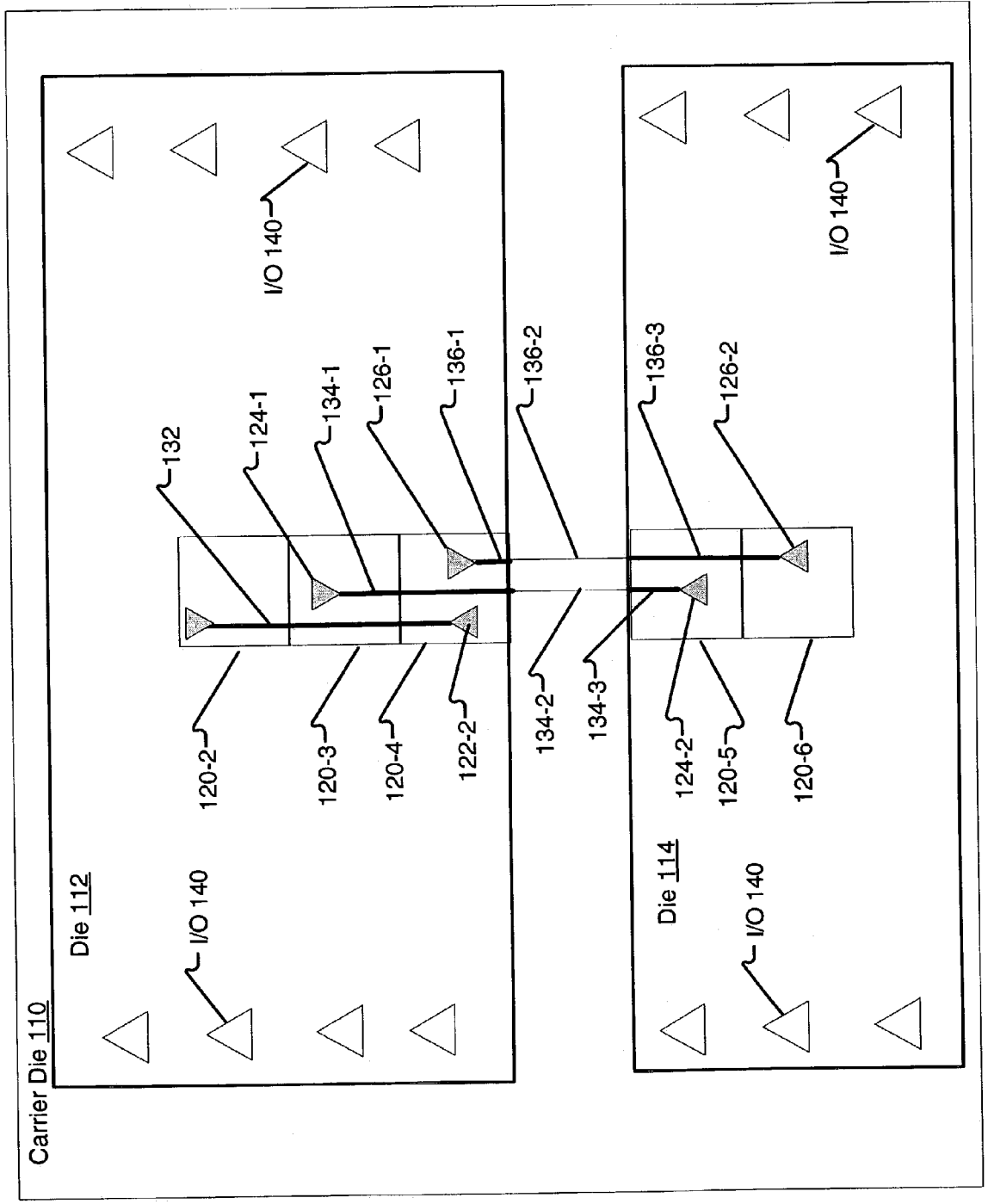
FIG. 4 is a simplified schematic of a MCM architecture of an embodiment of the present invention.

FIG. 4 is a simplified schematic of a MCM architecture of an embodiment of the present invention. Two dice, e.g., die 112 and die 114, are positioned next to each other and both are positioned above carrier die 110. There is a group of six aligned regions, i.e., 120-1, 120-2, 120-3, 120-4, 120-5, and 120-6, which are arranged in a column. In other embodiments, they may be arranged in other aligned configurations. Each of the six regions includes one or more programmable logic modules and each region has the same or similar electrical circuits as the other regions. For example, region 120-1 has a line driver 122-1 that drives a signal line 132 which is a direct connection to another line driver 122-2 in a non-adjacent region 120-4, that has two regions 120-2 and 120-3 that signal line 132 by-passes. Similarly, driver 124-1 in region 120-3 is directly connected to driver 124-2 in region 120-5 via signal line sections 134-1, 134-2 and 134-3. And driver 126-1 in region 120-4 is directly connected to driver 126-2 in region 120-6 via signal line sections 136-1, 136-2 and 136-3. There are line drivers on both ends to support traffic going either way.

Four of the six regions, i.e., 120-1 to 120-4, are on die 112 and two of the six regions, i.e., 120-5 and 120-6, are on die 114. Signal line 132 carries intra-die signals. Both dice 112 and 114 have I/O blocks 140 which are the interfaces between the on-chip signals and the normal off-chip signals. For inter-die signals, e.g., between line drivers 124-1 and 124-2 and 126-1 and 126-2, I/O blocks 140 are not used, but there is a direct connection, illustrated by lines 134-2 and 136-2 respectively, which are both located on carrier die 110. In one embodiment, line 134-2 continues under line 134-1 (not shown) and is then connected to line driver 124-1, and line 134-2 continues under line 134-3 (not shown) and is then connected to line driver 124-2. Similarly, line 136-2 goes under lines 136-1 and 136-3 (not shown) to be connected to line drivers 126-1 and 126-2. Thus the inter-chip non-adjacent region connections (or freeways) have a greater time delay than intra-chip non-adjacent region connections (freeways), e.g., line 132. However, since the signal lines do not go through I/O blocks and are direct connections, they are significantly faster than normal chip to chip communications. Also, unlike the prior art field programmable MCM system, there are no gateway switches that the non-adjacent region connections must pass through. These gate switches have the disadvantage of being bottlenecks for high-speed transmission.

FIG. 5A is a simplified diagram of an MCM 163 of an embodiment of the present invention. The MCM has wire bond pads 158. A carrier die 150 has placed on top of it three smaller dice, i.e., 152, 154, and 156 using flip-chip techniques. The three smaller dice, i.e., 152, 154, and 156, are substantially identical in structure and connected together via connection wires or metal traces (not shown) located on the carrier die 150. As an illustration, each of the smaller die may be a slice of an FPGA with dimensions of 6 mm×23 mm. Selected columns of tiles in each slice are connected vertically by long lines. An expanded view of region 160 is shown in FIG. 6. Expanded views of region 162 are shown in FIGS. 7, 8A, 8B, 9A, and 9B. In the expanded views of region 162, in order to avoid obscuring the invention with too many details, connections for five tiles are shown for illustration purposes only. Embodiments of the present invention include any connections between two or more non-adjacent tiles.

One of the advantages of FIG. 5A is that there are a substantial number, for example, hundreds or thousands or more, of connections between two smaller dice, such as dice 152 and 154 or dice 154 and 156. As described further below, each die has many columns, where each column has many tiles. The connection of tiles between dice is done so that there is in effect an aggregate column, e.g., 163, across dice 152, 154, and 156. Thus as explained above in reference to FIGS. 3 and 4, the number of connections between non-adjacent tiles are substantially the same, but now they are stretched across multiple dice. As seen from FIG. 7, the connections are made by the many bump pads 244 in each column. Hence a die, e.g., 152, 154, or 156, may have hundreds or thousands or more bump pads covering approximately a majority to three-quarters of one surface of the die.

It should be understood that MCM 163 is a simplified illustration of one embodiment of the present invention. Well known implementation details have been simplified or excluded so not to obscure the invention. In addition, other embodiments include two or more homogeneous or heterogeneous dice. An example of two heterogeneous dice may be, die 154 which may include programmable logic, an embedded microprocessor or digital signal processing (DSP) processor, or other application specific integrate circuit (ASIC) and a Multi-gigabit (MGT) I/O circuit, while die 152 may only have programmable logic (die 156 is absent in this example). Also in other embodiments the dice 152, 154, and 156 may have dimensions smaller or larger than 6 mm×23 mm and may have different dimensions from each other. Also in other embodiments the dice 152, 154, and 156 may have no spacing between each other, and the appropriate top and bottom edges may abut each other.

Figure 5B:
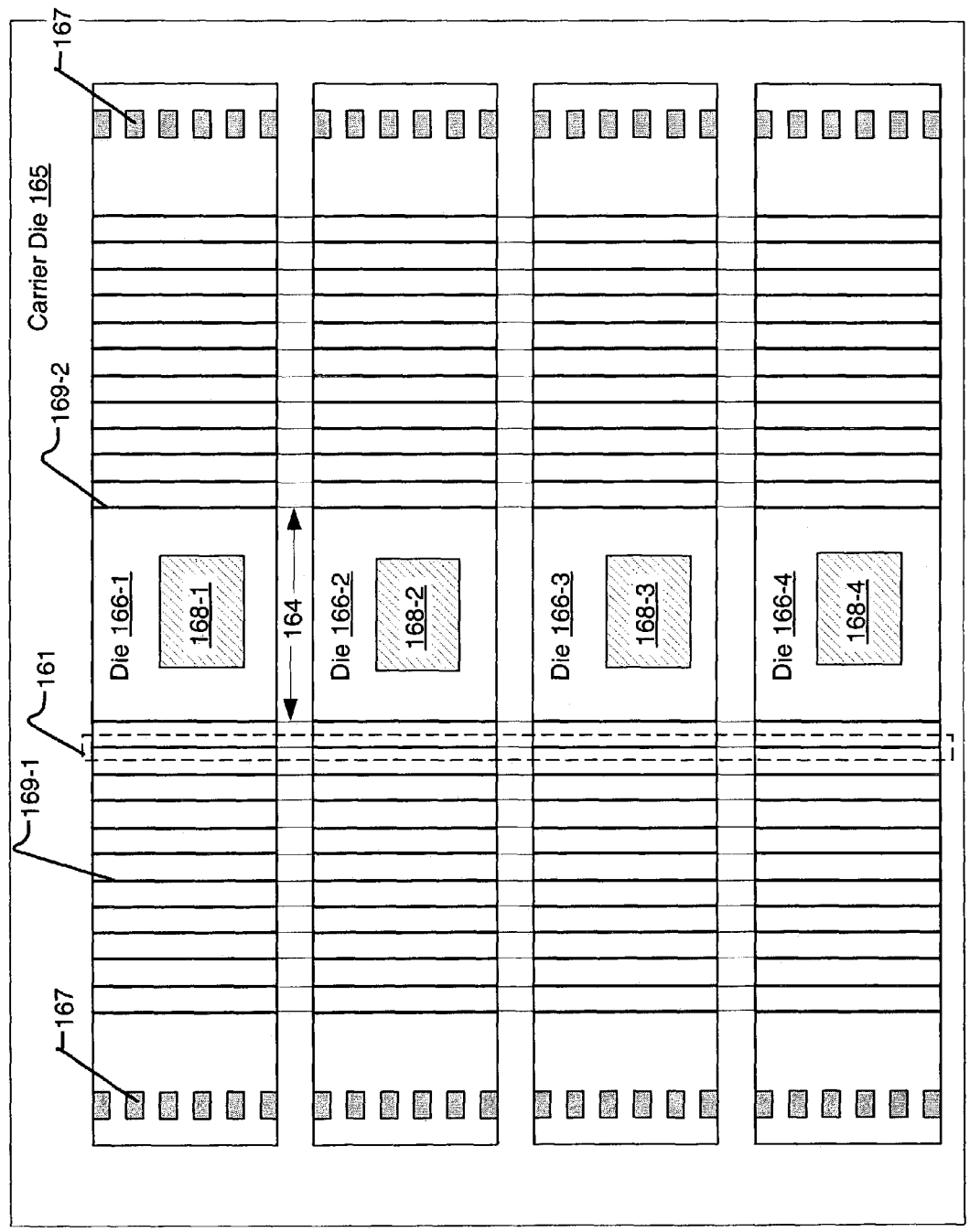
FIG. 5B is a floor plan overview of another embodiment of the present invention.

FIG. 5B is a floor plan overview of another embodiment of the present invention. Smaller dice 166-1, 166-2, 166-3, and 166-4 are placed on top of carrier die 165. Select I/Os 167 are located on the horizontal edges of the smaller dice. Each smaller die, i.e., 166-1, 166-2, 166-3, and 166-4, has its own configuration logic 168-1, 168-2, 168-2, and 168-4, respectively. Hence each smaller die can be tested separately and only the dice that past the testing, i.e., the good dice, are used. In this embodiment a columnar group of tiles is illustrated by line 169-1 and a another columnar group of tiles is illustrated by line 169-2. The dotted vertical lines 164 represent the connections between die. Each dotted vertical line 164, represents many wires or metal traces connecting many tiles on two adjacent dice, e.g., die 166-1 connecting to die 166-2. The columns in dotted region 161 shows an example of a aggregate column having columns on dice 166-1, 166-2, 166-3, and 166-4. Hence the four smaller dice, 166-1 to 166-4, make up what is in effect a large die with aggregate columns like aggregate column 161.

An example of a columnar group of tiles can be found in co-pending U.S. patent application Ser. No. 10/608,404 entitled, "Columnar Floorplan," by Steve Young, filed Jul. 11, 2003, which is herein incorporated by reference in its entirety. The die described in the "Columnar Floorplan" application may be used, for example, as one or more of the above smaller dice, i.e., 166-1, 166-2, 166-3, and 166-4.

FIG. 6 is an expanded view of region 160 of FIG. 5A of one embodiment of the present invention. Region 160 includes a column of tiles, 180-1 to 180-N1, group 182 (which represents the group of N2 identical tiles without pads), and 184-1 to 184-N3, where N1, N2, and N3 are integers and in one example, N1=24, N2=16, and N3=24. The column of tile is divided into three sub-groups as indicated by regions 170, 172, and 174. Region 170 has identical tiles 180-1, 180-2, 180-3, 180-4, 180-5 to 180-N1. Region 172 has identical tiles 182. Region 174 has identical tiles 184-1, 184-2, 184-3, 184-4, 184-5 to 184-N3. Note the internal details of each tile have been simplified and are for illustration purposes only.

For the example of N1=24, N2=16, and N3=24, the 24 tiles in region 170 may be used to connect to a similar column on a die above die 152 (not shown in FIG. 5A). The 24 tiles in region 174 may be used to connect to a similar column on a die below die 152, in this case that is die 154. In one embodiment only every other tile is used in regions 170 and 174 to connect to the tiles in the adjacent die, for example, tiles 180-1, 180-3, 180-5, and the like in region 170, and tiles 184-1, 184-3, 184-5, and the like in region 174. In an alternative embodiment every tile, rather than every other tile, is used in regions 170 and 174 to connect to the tiles in the adjacent dice. The tiles in region 172 have only connections to tiles internal to die 152.

Some of the 24 tiles in region 174 on die 152 are connected to some of the 24 tiles in an aligned column in die 154 below in a region similar to region 170. For example, tiles 184-1, 184-2, and 184-23 may be directly connected to the $23^{rd}$, $21^{st}$ and $1^{st}$ tiles in die 154, respectively, via carrier die 150. This adjacent die connection can also be illustrated by visualizing the bottom edge 175 wrapped around to the top edge 176; tile 184-5 in region 174 is connected via wire 183-1 and 183-2 to tile 180-1 in region 170. The reason every other tile is used rather than every tile is because of the limitation on bump density of current flip-chip technology. However, as flip-chip technology or other technology for stacking dice improves, every tile or denser patterns, such as multiple bumps per tile, may be used.

Figure 8A:
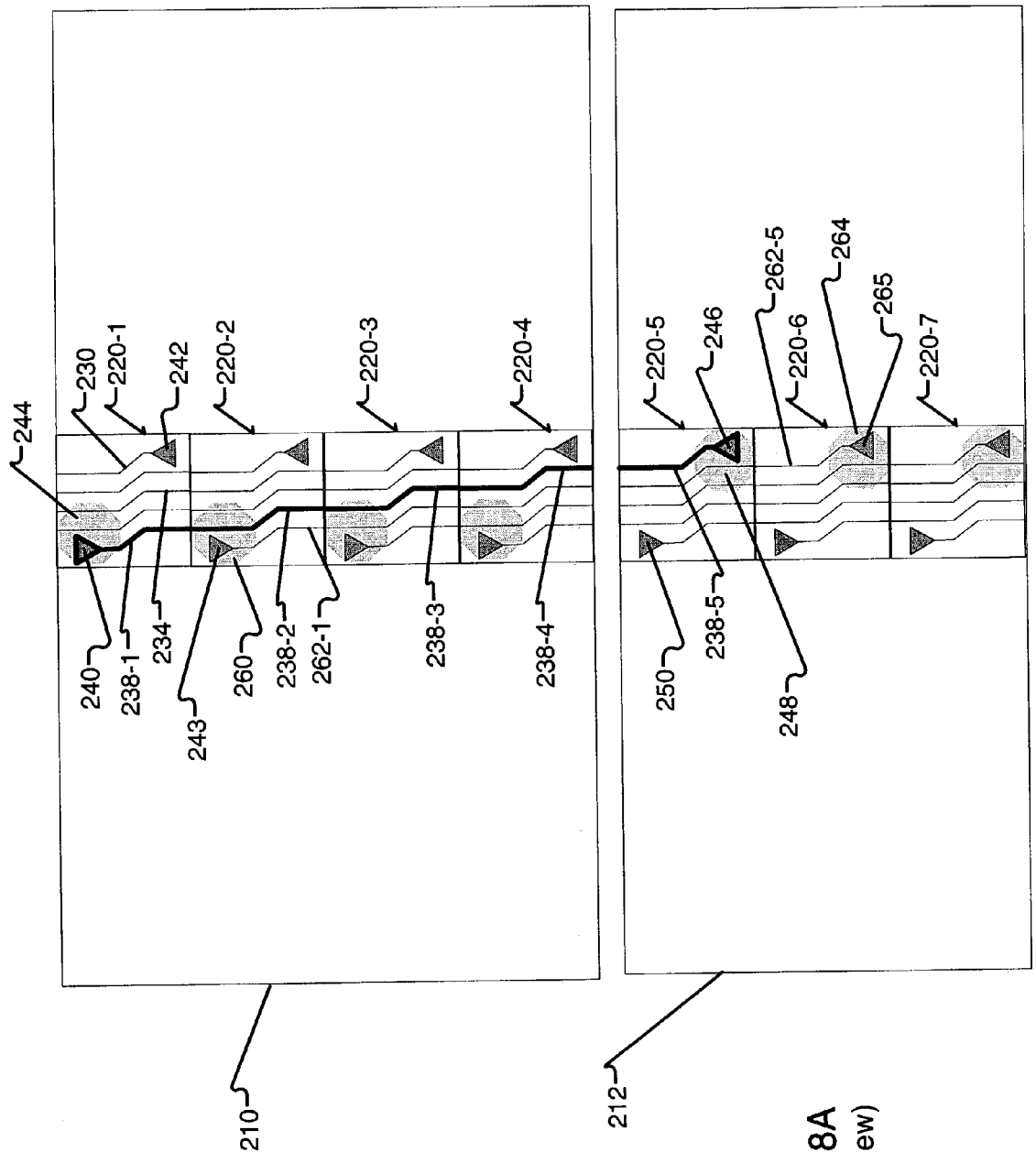
FIG. 8A is a top view of the dice 152 and 154 for the region 162 of an aspect of the present invention.

FIG. 7 is an illustrative side view of region 162 of FIG. 5A of another embodiment of the present invention. Region 210 is part of die 152 and region 212 is part of die 154. Region 310 is part of carrier die 150. Bump pad or pad 244 has solder bump 254 and is connected to line driver 240 in tile 220-1 (see. FIG. 8A). Pad 244 may have a pad pitch in one embodiment of about 170 μm. Solder bump 254 will be soldered on to pad 312 which is directly connected to pad 314 via wire or metal trace 320. The wire or metal trace 320 may have in one embodiment a width of about 2 μm. Thus, because the size of the wire is much smaller than the pad size, there can be many wires on the carrier die connecting many pads in a column. Pad 314 will be soldered to solder bump 256 on pad 248. Pad 248 is connected to line driver 246 in tile 220-5 (see FIG. 8A). FIG. 9B shows the wire (or metal trace) 320 on the carrier die 150 connecting pads 312 to 314. Another example with reference to FIGS. 7, 8A and 9B, shows a pad 260 connected to line driver 243, which is connected to pad 264 and line driver 265 via pads 324 and 328 and wire 326 in region 310.

FIGS. 8A, 8B, 9A, and 9B are top and bottom views of region 162 with the side view of FIG. 7. With respect to FIG. 5A the top view looks down on the MCM 165. The bottom view is from the perspective of an observer underneath the carrier die 150 looking up. The same label numbers are used in each figure for the same parts to facilitate explanation. Unlike FIG. 6, FIGS. 8A, 8B, 9A, and 9B show another embodiment of the present invention, where each tile on die 152 is connected to a tile on die 154 in region 162.

FIG. 8A is a top view of the dice 152 and 154 for the region 162 of an aspect of the present invention. Region 210 has four substantially identical tiles, i.e., 220-1, 220-2, 220-3, and 220-4. Tile 220-1 has line drivers 240 and 242, pad 244, and a plurality of wires or metal traces, e.g., 230, 234, and 238-1. Line driver 240 is connected to wires 238-1, 238-2, 238-3, and 238-4. Region 212 has three substantially identical tiles 220-5, 220-6, and 220-7. Line driver 246 in region 220-5 is connected to wire 238-5. Wires 238-1 to 238-5 are shown collectively as wires 238 in FIG. 7. Region 220-5 also has line driver 250 and pad 248. The bold lines, e.g., 238-1, 238-2, 238-3, 238-4 and 238-5, between line drivers 240 (pad 244) and 246 (pad 248) are shown in FIG. 7 as discontinuous line 238. The corresponding connection between pads 312 and 314, via wire 320 on the carrier die are shown by the bold line having the same labels on both FIGS. 9A and 9B.

Figure 8B:
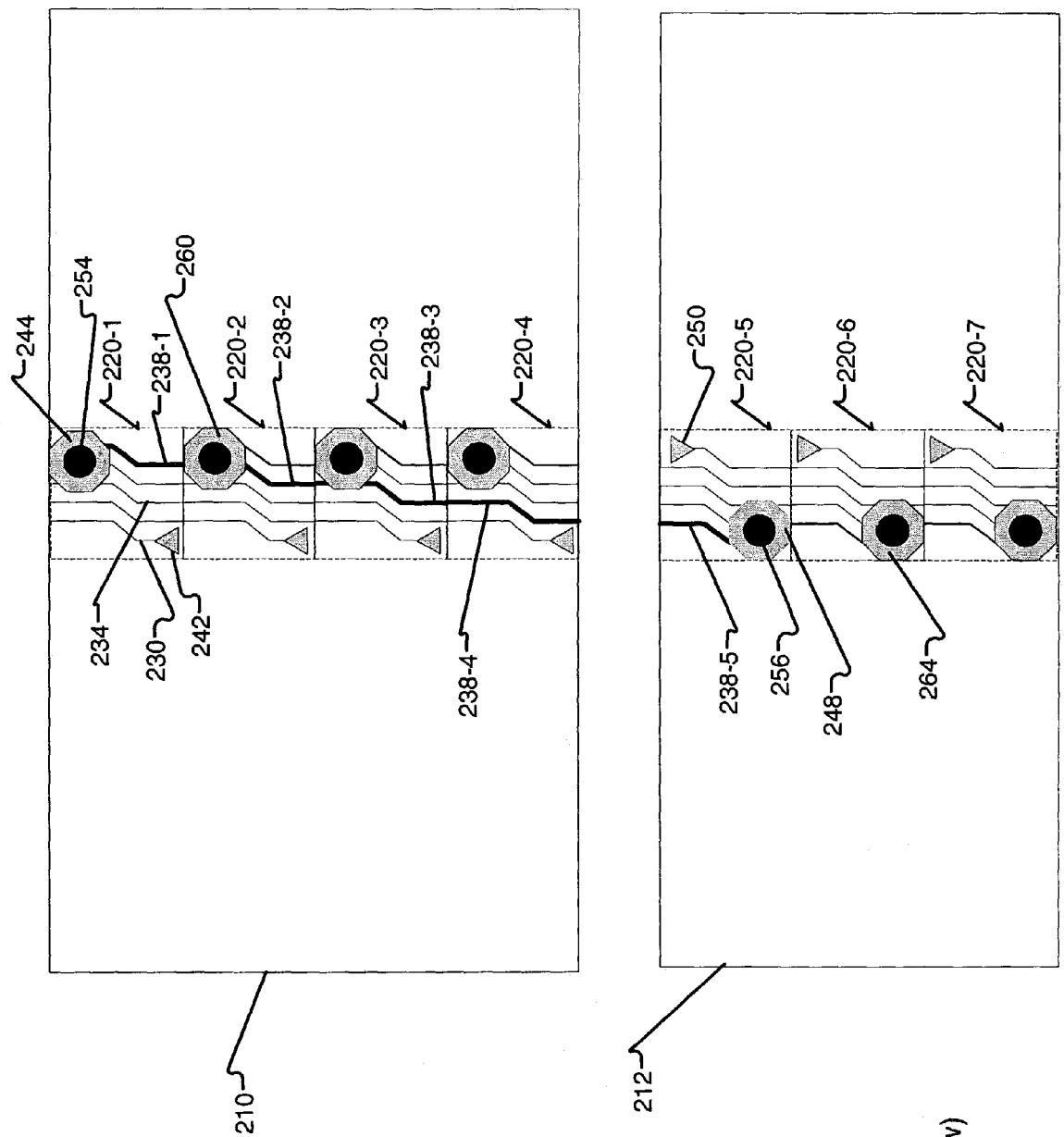
FIG. 8B is a bottom view of the dice 152 and 154 for region 162 of an aspect of the present invention.

FIG. 8B is a bottom view of the dice 152 and 154 for region 162 of an aspect of the present invention. For tile 220-1, for example, the solder bump 254 on top of pad 244 as shown in FIG. 7 can be seen.

Figure 9A:
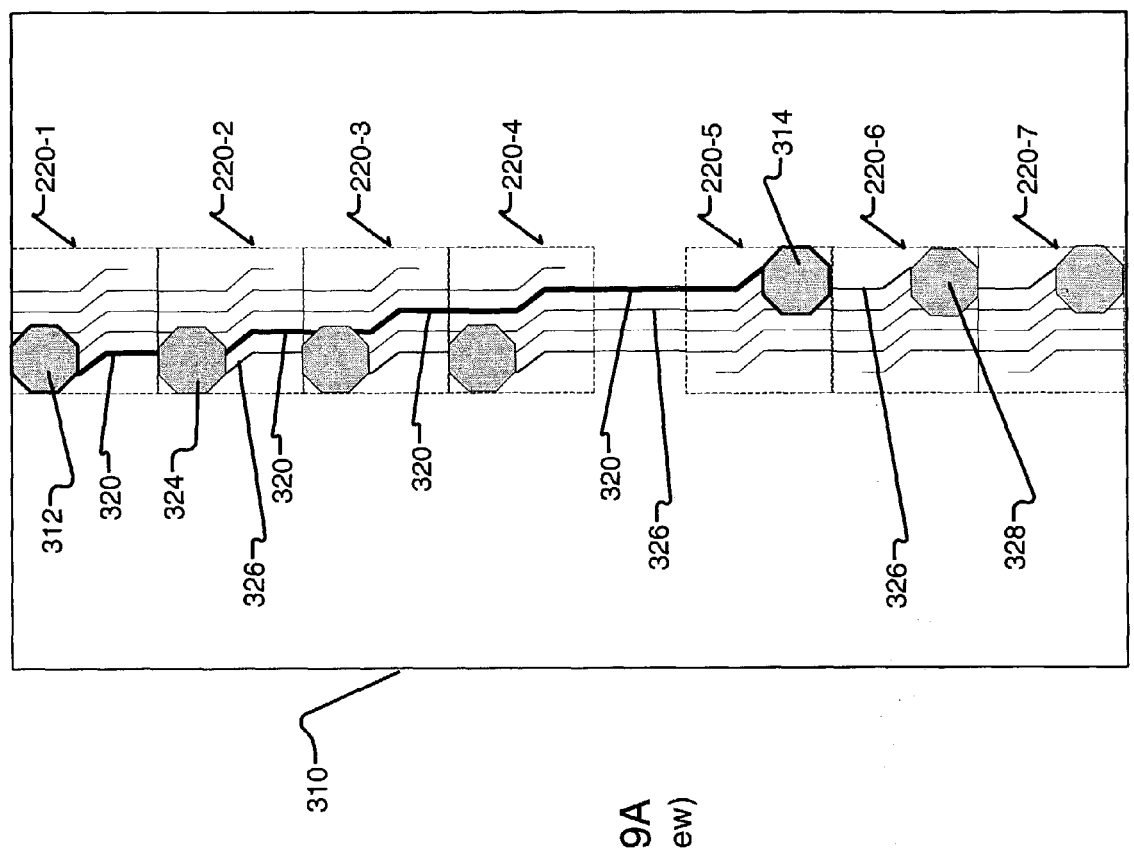
FIG. 9A is a top view of the carrier die (with the dice 152 and 154 removed) for region 162 of an aspect of the present invention.
Figure 9B:
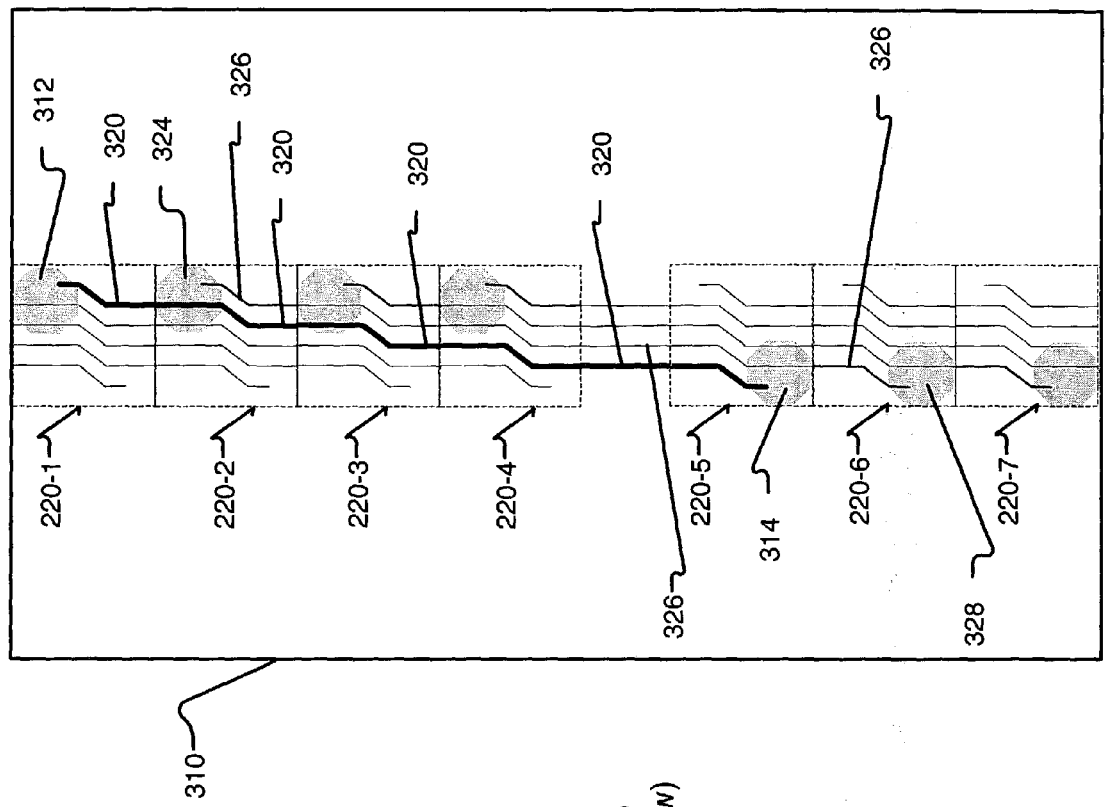
FIG. 9B is a bottom view of the carrier die in region 162 corresponding to the top view of FIG. 9A.

FIG. 9A is a top view of the carrier die 150 (with the dice 152 and 154 removed) for region 162 of an aspect of the present invention. The outlines for tiles 220-1 to 220-7 are shown in dotted line boxes to indicate approximately where these tiles on dice 152 and 154 are located above the carrier die. Wire (or metal trace) 320 connects pad 312 to pad 314, and wire (or metal trace) 326 connects pad 324 to pad 328 as also shown in FIG. 7.

FIG. 9B is a bottom view of carrier die 150 in region 162 corresponding to the top view of FIG. 9A. Wires (or metal traces) 320 and 326 can be seen more clearly as continuous connections between pads pairs (312, 314), and (324, 328), respectively.

Although the invention has been described in connection with several embodiments, it is understood that this invention is not limited to the embodiments disclosed, but is capable of various modifications, which would be apparent to one of ordinary skill in the art. For example, one or more of the tiles may have one or more programmable digital signal processing functions in addition to or in place of programmable logic. Thus, the invention is limited only by the following claims.

What is claimed is:

1. A multi-chip device comprising:
    a group of aligned regions, each region having a programmable interconnection;
    a first integrated Circuit (IC) having a first region of the group of aligned regions;
    a second IC having a second region of the group of aligned regions; and
    a supporting structure having one or more signal lines, wherein the first region is directly connected to the second region via one of the signal lines, wherein a circuit in the first region is connected to a circuit in the second region without use of any Input/Output (I/O) bank on the first IC; and
    wherein the first region includes a line driver and a pad, the pad configured to connect the first region to the second region.

2. The multi-chip device of claim 1 wherein the supporting structure comprises a carrier die.

3. The multi-chip device of claim 1 wherein each region further comprises programmable logic.

4. The multi-chip device of claim 1 wherein each region of the group of aligned regions on the first IC is substantially identical.

5. The multi-chip device of claim 4 wherein each region of the group of aligned regions on the second IC is substantially identical.

6. The multi-chip device of claim 1 wherein the second region includes a tile of a field programmable gate array.

7. A multi-chip module having:
    a first die having a first column of a first plurality of tiles, wherein each tile of the first plurality includes programmable logic;
    a second die having a second column of a second plurality of tiles, wherein the second column is aligned with the first column; and
    a supporting substrate having a plurality of signal lines, wherein a tile in the first column is directly connected to a tile in the second column via one of the plurality of signal lines and without using any Input/Output (I/O) bank on the first die; and wherein the tile in the first column further comprises a line driver and a pad, the pad configured to connect the tile in the first column to the tile in the second column.

8. The multi-chip module of claim 7 wherein the tile in the first column comprises a logic block and a switching block.

9. The multi-chip module of claim 7 wherein the first die includes configuration logic.

10. The multi-chip module of claim 7 wherein the first die includes a portion of a programmable logic device.

11. The multi-chip module of claim 7 wherein the first die and the second die are essentially identical, and wherein the first die has first configuration logic and the second die has second configuration logic.

12. The multi-chip module of claim 7 wherein the first die and the second die are heterogeneous.

13. The multi-chip module of claim 12 wherein the first die has programmable logic and the second die has programmable logic and an embedded application specific integrated circuit (ASIC).

14. The multi-chip module of claim 12 wherein the ASIC is selected from a group consisting of a microprocessor, a digital signal processor, and an arithmetic processing module.

15. A method for creating a multi-chip module (MCM) having a plurality of integrated circuits (ICs), each IC of the plurality of ICs having programmable logic arranged in columns, the method comprising:

positioning a first IC of the plurality of IC's in the MCM, the first IC having a first column of regions, wherein each region has a logic block;

positioning a second IC of the plurality of IC's in the MCM, the second IC having a second column of regions, wherein the second column is aligned with respect to the first column; and configuring a signal wire to directly connect a first region in the first column to a second region in the second column; and configuring another signal wire to directly connect a third region in the first column to a fourth region in the second column, wherein the third region is adjacent to the first region, and the fourth region is adjacent to the second region; and wherein a logic block in the first region is connected to a logic block in the second region via a line driver.

16. The method of claim 15 wherein the first IC includes a portion of a programmable logic device (PLD).

17. A multi-chip module, having programmable interconnections, comprising:

means for arranging a first plurality of substantially identical connected regions on a first integrated circuit (IC);

means for arranging a second plurality of substantially identical connected regions on a second IC; and means for connecting a first region in the first plurality to a second region in the second plurality via a driver circuit; and wherein a first region of the first plurality has means for directly connecting to a second non-adjacent region of the first plurality.

18. A system having a plurality of dice, comprising:

a first die of the plurality of dice comprising a first plurality of columns, each column of the first plurality of columns having a first plurality of substantially identical elements;

a second die of the plurality of dice comprising a second plurality of columns, each column of the second plurality of columns having a second plurality of substantially identical elements; and a plurality of signal lines connecting via a plurality of drivers not part of an I/O block, each element of the first plurality of substantially identical elements of each column of the first plurality of columns with an associated element of the second plurality of substantially identical elements of an associated column of the second plurality of columns.

19. The system of claim 17 wherein a particular column of the first plurality of columns and the particular column's associated column form an aggregated column of the device.

20. The system of claim 17 wherein the plurality of signal lines include greater than 100 lines.

21. The system of claim 17 wherein the plurality of signal lines include greater than 1000 lines.

22. The system of claim 17 further comprising a carrier die having the plurality of signal lines.

23. The system of claim 17 wherein each column of the first plurality of columns is filled with the first plurality of substantially identical elements, and each column of the second plurality of columns is filled with the second plurality of substantially identical elements.

24. A system having a plurality of dice, the system comprising:

a first die of the plurality of dice, comprising all input/output blocks on the first die for communicating with circuits located outside of the first die, and a first function block connected to a first interconnect line;

a second die of the plurality of dice, comprising second input/output blocks for communicating with circuits located outside of the second die, and a second function block connected to a second interconnect line; and a signal line connecting the first interconnect line to the second interconnect line via a driver, wherein a signal propagates from the first interconnect line to the second interconnect line without propagating through any of the input/output blocks of the first die.

25. The system of claim 22 wherein the signal does not propagate through any of the second input/output blocks of the second die.

26. The system of claim 22 wherein the first function block is connected to the second function block via the signal line.

27. The system of claim 22 further comprising a carrier die plurality of dice upon which the first die and second die are mounted, wherein the carrier die comprises the signal line.

28. The system of claim 22 wherein the first function block and the second function block are configurable logic blocks.

29. The system of claim 22 wherein the first function block is an application specific circuit.

30. A multi-chip module having a plurality of dice, the system comprising
- a first die of the plurality of dice comprising a first programmable interconnection point connected to a second programmable interconnection point via a first interconnect wire;
- a driver connected to the first interconnect wire, the driver not part of an input/output block of the first die;
- a second die of the plurality of dice comprising a third programmable interconnection point connected to a fourth programmable interconnection point via a second interconnect wire;
- a wire on a third die of the plurality of dice connecting the driver to the second interconnect wire.

31. The multi-chip module of claim 28 wherein the driver is relatively smaller than a driver of an input/output block.

* * * * *